US012656405B2

(12) United States Patent (10) Patent No.: US 12,656,405 B2
Yoon et al. (45) Date of Patent: Jun. 16, 2026

(54) CHARGE PROTOCOL INSPECTION APPARATUS AND OPERATING METHOD THEREOF

(71) Applicant: LG Energy Solution, Ltd., Seoul (KR)

(72) Inventors: Yeo Kyung Yoon, Daejeon (KR); Jeong In Yu, Daejeon (KR); Yong Jun Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 32 days.

(21) Appl. No.: 18/291,987

(22) PCT Filed: Sep. 30, 2022

(86) PCT No.: PCT/KR2022/014850
§ 371 (c)(1),
(2) Date: Jan. 25, 2024

(87) PCT Pub. No.: WO2023/106583
PCT Pub. Date: Jun. 15, 2023

(65) Prior Publication Data
US 2024/0353497 A1    Oct. 24, 2024

(30) Foreign Application Priority Data
Dec. 10, 2021    (KR) ........................ 10-2021-0176328

(51) Int. Cl.
*G01R 31/389*        (2019.01)
*G01R 31/367*        (2019.01)
(Continued)

(52) U.S. Cl.
CPC ......... *G01R 31/389* (2019.01); *G01R 31/367* (2019.01); *G01R 31/388* (2019.01); *H01M 10/446* (2013.01)

(58) Field of Classification Search
None
See application file for complete search history.

(56) References Cited

U.S. PATENT DOCUMENTS

2003/0030414 A1*    2/2003    Suzuki .................. H01M 10/48
                                                              324/427
2008/0122399 A1    5/2008    Nishino et al.
(Continued)

FOREIGN PATENT DOCUMENTS

CN            101635470 A        1/2010
CN            104769806 A        7/2015
(Continued)

OTHER PUBLICATIONS

Extended European Search Report including Written Opinion for Application No. 22904417.7, dated Dec. 18, 2024. 7 pgs.
(Continued)

*Primary Examiner* — Jas A Sanghera
(74) *Attorney, Agent, or Firm* — Lerner David LLP

(57)        ABSTRACT

A charge protocol inspection apparatus including an information obtaining unit is configured to obtain information about a charge protocol of a battery cell, an open circuit voltage (OCV) corresponding to a state of charge (SoC) of the battery cell, and a reference internal resistance of the battery cell, calculate an internal resistance of the battery cell during charge based on the information about the charge protocol and the OCV corresponding to the SoC of the battery cell, and compare the reference internal resistance of the battery cell with the internal resistance of the battery cell during charge.

14 Claims, 6 Drawing Sheets

100

(51) Int. Cl.
    *G01R 31/388*        (2019.01)
    *H01M 10/44*        (2006.01)

(56)          References Cited

U.S. PATENT DOCUMENTS

| | | |
|---|---|---|
| 2008/0136378 A1 | 6/2008 | Iwahana et al. |
| 2011/0181249 A1 | 7/2011 | Deguchi et al. |
| 2012/0176140 A1 | 7/2012 | Kitsuani et al. |
| 2015/0249349 A1 | 9/2015 | Binder et al. |
| 2015/0357852 A1 | 12/2015 | Nakao et al. |
| 2017/0141444 A1* | 5/2017 | Kawahara ............ G01R 31/392 |
| 2018/0076633 A1 | 3/2018 | Fujita et al. |
| 2021/0247457 A1 | 8/2021 | Ko et al. |
| 2022/0221527 A1 | 7/2022 | Yoon et al. |
| 2022/0231515 A1 | 7/2022 | Bae et al. |
| 2022/0278540 A1 | 9/2022 | Kim et al. |
| 2023/0288488 A1* | 9/2023 | Hattori ............... G01R 31/3842 |
| 2023/0408591 A1 | 12/2023 | Ko et al. |
| 2024/0178687 A1 | 5/2024 | Bae et al. |

FOREIGN PATENT DOCUMENTS

| | | |
|---|---|---|
| CN | 113328497 A | 8/2021 |
| JP | 2001-015180 A | 1/2001 |
| JP | 2002-286820 A | 10/2002 |
| JP | 2008136330 A | 6/2008 |
| JP | 4401734 B2 | 1/2010 |
| JP | 5356465 B2 | 12/2013 |
| JP | 2016-091830 A | 5/2016 |
| JP | 2017203749 A | 11/2017 |
| JP | 201846667 A | 3/2018 |
| JP | 2022174885 A | 11/2022 |
| KR | 2012-0068919 A | 6/2012 |
| KR | 101222220 B1 | 1/2013 |
| KR | 2013-0087097 A | 8/2013 |
| KR | 2017-0006400 A | 1/2017 |
| KR | 2017-0060732 A | 6/2017 |
| KR | 101841237 B1 | 3/2018 |
| KR | 2019-0080102 A | 7/2019 |
| KR | 20200105561 A | 9/2020 |
| KR | 2021-0004122 A | 1/2021 |
| KR | 2021-0004646 A | 1/2021 |
| KR | 2021-0007698 A | 1/2021 |
| KR | 2021-0074001 A | 6/2021 |
| KR | 2021-0098215 A | 8/2021 |
| KR | 2021-0100845 A | 8/2021 |
| TW | 200928402 A | 7/2009 |
| WO | 2021118049 A1 | 6/2021 |

OTHER PUBLICATIONS

International Search Report for PCTKR2022014850 mailed Jan. 10, 2023. 3 pgs.
Search Report dated Mar. 21, 2026 from the Office Action for Chinese Application No. 2022800522061 issued Mar. 25, 2026, pp. 1-3.

\* cited by examiner

100

CHARGE PROTOCOL INSPECTION APPARATUS AND OPERATING METHOD THEREOF

CROSS-REFERENCE TO RELATED APPLICATIONS

This application is a national phase entry under 35 U.S.C. § 371 of International Application No. PCT/KR2022/014850, filed on Sep. 30, 2022, which claims priority to and the benefit of Korean Patent Application No. 10-2021-0176328 filed in the Korean Intellectual Property Office on Dec. 10, 2021, the entire contents of which are incorporated herein by reference.

TECHNICAL FIELD

Embodiments disclosed herein relate to a charge protocol inspection apparatus and an operating method thereof.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium-ion batteries. Among the secondary batteries, a lithium-ion battery has a much higher energy density than those of the conventional Ni/Cd batteries, Ni/MH batteries, etc. Moreover, the lithium-ion battery may be manufactured to be small and lightweight, such that the lithium-ion battery has been used as a power source of mobile devices, and recently, a use range thereof has been extended to power sources for electric vehicles, attracting attention as next-generation energy storage media.

Recent batteries have a fast charging function. Fast charge may be related to the fast charge life of the battery depending on a configuration scheme of a charge protocol. Thus, a method for configuring a charge protocol is required, and there is a method of manufacturing three electrodes of a monocell type to identify a depth of charging and deriving a charge protocol for a large cell based on the identified depth of charging of the monocell type. However, in a process of conversion from a monocell to a large cell, there may be many factors that are not considered, such as a resistance of the large cell, heat emission during fast charge, etc.

SUMMARY

Technical Problem

Embodiments disclosed herein aim to provide a charge protocol inspection apparatus and an operating method thereof in which an internal resistance of a battery cell is calculated and suitability of a charge protocol is determined based on the calculated internal resistance.

Technical problems of the embodiments disclosed herein are not limited to the above-described technical problems, and other unmentioned technical problems would be clearly understood by one of ordinary skill in the art from the following description.

Technical Solution

A charge protocol inspection apparatus according to an embodiment disclosed herein includes memory storing instructions and one or more processors configured to execute the instructions to obtain information about a charge protocol of a battery cell, an open circuit voltage (OCV) corresponding to a state of charge (SoC) of the battery cell, and a reference internal resistance of the battery cell, calculate an internal resistance of the battery cell during charge based on the information about the charge protocol and the OCV corresponding to the SoC of the battery cell, and compare the reference internal resistance of the battery cell with the calculated internal resistance of the battery cell during charge.

In an embodiment, the information about the charge protocol of the battery cell may include a voltage corresponding to the SoC of the battery cell while the battery cell is charged according to the charge protocol.

In an embodiment, the one or more processors may be further configured to calculate an over-voltage corresponding to the SoC of the battery cell, wherein the over-voltage is a difference between the voltage corresponding to the SoC of the battery cell and the OCV corresponding to the SoC of the battery cell and calculate the internal resistance of the battery cell during charge by dividing the calculated over-voltage corresponding to the SoC of the battery cell by a current flowing through the battery cell.

In an embodiment, the one or more processors may be further configured to calculate a respective internal resistance of the battery cell during charge for each of a plurality of charge protocols.

In an embodiment, the one or more processors may be further configured to compare the reference internal resistance of the battery cell with each respective internal resistance of the battery cell during charge.

In an embodiment, the one or more processors may be further configured to calculate a respective internal resistance of the battery cell during charge for each of a plurality of charge protocols, and compare the reference internal resistance of the battery cell with the respective internal resistance of the battery cell during charge, for each charge protocol.

In an embodiment, the one or more processors may be configured to determine a respective degree of similarity between the reference charge protocol of the battery cell and each respective internal resistance of the battery cell.

In an embodiment, the one or more processors may be further configured to compare the reference internal resistance of the battery cell with internal resistances of the battery cell calculated while charging from a predetermined first SoC to a predetermined second SoC.

In an embodiment, the charge protocol may include information about a current charging the battery, associated with an amount of time required for charging the battery with the current.

In an embodiment, the amount of time required for charging the battery may be 30 minutes or less.

In an embodiment, the one or more processors may be configured to calculate a respective internal resistance of the battery cell during charge for each of a plurality of charge protocols, and two or more of the charge protocols may be fast charge protocols capable of charging the battery in 30 minutes or less.

An operating method of a charge protocol inspection apparatus according to an embodiment disclosed herein includes obtaining, by one or more processors, information about a charge protocol of a battery cell, an open circuit voltage (OCV) corresponding to a state of charge (SoC) of the battery cell, and a reference internal resistance of the battery cell, calculating, by the one or more processors, an internal resistance of the battery cell during charge based on the information about the charge protocol and the OCV corresponding to the SoC of the battery cell, and comparing, by the one or more processors, the reference internal resistance of the battery cell with the calculated internal resistance of the battery cell during charge.

In an embodiment, the information about the charge protocol of the battery cell may include a voltage corresponding to the SoC of the battery cell while the battery cell is charged according to the charge protocol.

In an embodiment, calculating the internal resistance of the battery cell may include calculating an over-voltage corresponding to the SoC of the battery cell, wherein the over-voltage is a difference between the voltage corresponding to the SoC of the battery cell and the OCV corresponding to the SoC of the battery cell and calculating the internal resistance of the battery cell during charge by dividing the calculated over-voltage corresponding to the SoC of the battery cell by a current flowing through the battery cell.

Advantageous Effects

A charge protocol inspection apparatus and an operating method thereof according to an embodiment disclosed herein may calculate an internal resistance of a battery cell for each charge protocol and determine based on the calculated internal resistance whether the charge protocol is suitable.

A charge protocol inspection apparatus and an operating method thereof according to an embodiment disclosed herein may determine suitability of a charge protocol based on an internal resistance by using a change of the internal resistance as a guide of the charge protocol because the change of the internal resistance is analyzed as originating from an anode.

In a charge protocol inspection apparatus and an operating method thereof according to an embodiment disclosed herein, a large cell may determine suitability of a charge protocol without manufacturing three electrodes of a mono-cell type.

Moreover, various effects recognized directly or indirectly from the disclosure may be provided.

DETAILED DESCRIPTION

Figure 1:
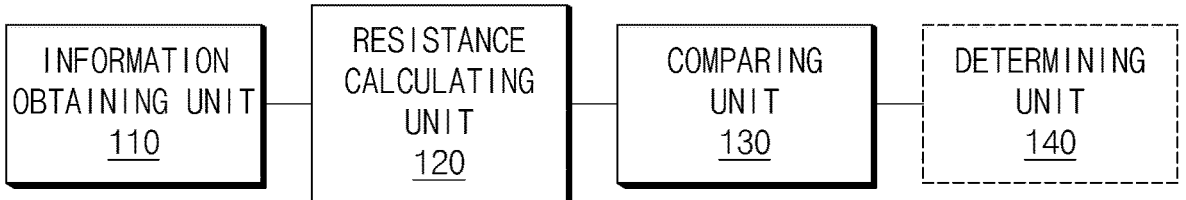
FIG. 1 is a block diagram of a charge protocol inspection apparatus according to an embodiment disclosed herein.

Hereinafter, embodiments disclosed in this document will be described in detail with reference to the exemplary drawings. In adding reference numerals to components of each drawing, it should be noted that the same components are given the same reference numerals even though they are indicated in different drawings. In addition, in describing the embodiments disclosed in this document, when it is determined that a detailed description of a related known configuration or function interferes with the understanding of an embodiment disclosed in this document, the detailed description thereof will be omitted.

To describe a component of an embodiment disclosed herein, terms such as first, second, A, B, (a), (b), etc., may be used. These terms are used merely for distinguishing one component from another component and do not limit the component to the essence, sequence, order, etc., of the component. The terms used herein, including technical and scientific terms, have the same meanings as terms that are generally understood by those skilled in the art, as long as the terms are not differently defined. Generally, the terms defined in a generally used dictionary should be interpreted as having the same meanings as the contextual meanings of the relevant technology and should not be interpreted as having ideal or exaggerated meanings unless they are clearly defined in the present application.

FIG. 1 is a block diagram of a charge protocol inspection apparatus according to an embodiment disclosed herein.

Referring to FIG. 1, a charge protocol inspection apparatus 100 according to an embodiment disclosed herein may include an information obtaining unit 110, a resistance calculating unit 120, and a comparing unit 130. In an embodiment, the charge protocol inspection apparatus 100 may further include a determining unit 140.

In an embodiment, the charge protocol may be configured with information about a current that charges the battery according to a step based on a time required for charging the battery. For example, the charge protocol may be configured as a protocol for fast charge. In another example, the charge protocol may be configured for each time for fast charge. According to an embodiment, a time for fast charge may be set to, but not limited to, 21 minutes, 30 minutes, etc.

The information obtaining unit 110 may obtain information about a charge protocol of a battery cell. For example, the information about the charge protocol of the battery cell may include a voltage with respect to an SoC of the battery cell when the battery cell is charged for each charge protocol.

The information obtaining unit 110 may obtain an open circuit voltage (OCV) with respect to the SoC of the battery cell. For example, the information obtaining unit 110 may obtain an OCV for each SoC.

The information obtaining unit 110 may obtain a reference internal resistance of the battery cell. For example, the information obtaining unit 110 may obtain an internal resistance when the battery cell is charged at a reference C-rate. In another example, a C-rate may mean the degree of a current to which the battery cell is charged for each step. In another example, the reference C-rate may be 0.33 C.

According to an embodiment, the information obtaining unit 110 may transmit the obtained information to the resistance calculating unit 120 or the comparing unit 130.

The resistance calculating unit 120 may calculate the internal resistance of the battery cell during charge based on the information about the charge protocol and the OCV corresponding to the SoC of the battery cell. For example, the resistance calculating unit 120 may calculate an over-voltage corresponding to the SoC of the battery cell, which is a difference between a voltage corresponding to the SoC of the battery cell and the OCV corresponding to the SoC of the battery cell. In this case, the resistance calculating unit 120 may calculate an over-voltage for each SoC of the battery cell.

The resistance calculating unit 120 may calculate the internal resistance of the battery cell during charge by dividing the calculated over-voltage corresponding to the SoC of the battery cell by a current flowing through the battery cell. For example, the resistance calculating unit 120 may calculate the internal resistance of the battery cell during charge for each SoC of the battery cell. In another example, the current flowing through the battery cell may be obtained from the information obtaining unit 110 and from a battery pack including the battery cell.

According to an embodiment, the resistance calculating unit 120 may calculate the internal resistance of the battery cell during charge for each charge protocol. For example, the resistance calculating unit 120 may calculate the internal resistance of the battery cell during charge for each SoC with respect to each charge protocol.

The comparing unit 130 may compare the reference internal resistance of the battery cell with the internal resistance of the battery cell during charge. For example, the comparing unit 130 may compare the reference internal resistance of the battery cell obtained from the information obtaining unit 110 with the internal resistance of the battery cell during charge, calculated by the resistance calculating unit 120.

In an embodiment, the comparing unit 130 may compare the reference internal resistance of the battery cell with the internal resistance of the battery cell during charge for each SoC. For example, the comparing unit 130 may compare the reference internal resistance of the battery cell with the internal resistance of the battery cell during charge, in a specific section of the SoC. In another example, the comparing unit 130 may calculate a difference between the reference internal resistance of the battery cell with the internal resistance of the battery cell during charge, for each charge protocol. In another example, the comparing unit 130 may sum an absolute value of the difference between the reference internal resistance of the battery cell with the internal resistance of the battery cell during charge, for each charge protocol. In another example, the comparing unit 130 may sample and compare the reference internal resistance of the battery cell with the internal resistance of the battery cell during charge, in a specific SoC.

In an embodiment, the comparing unit 130 may compare the reference internal resistance of the battery cell with the internal resistance of the battery cell during charge for each charge protocol. For example, the comparing unit 130 may perform comparison for each charge protocol based on a result of comparing the reference internal resistance of the battery cell with the internal resistance of the battery cell during charge for each SoC.

The charge protocol inspection apparatus 100 according to an embodiment disclosed herein may further include the determining unit 140. The determining unit 140 may determine a similarity to a reference charge protocol of the battery cell based on the result of comparison for each charge protocol, performed by the comparing unit 130. For example, the reference charge protocol may be a protocol for determining the reference internal resistance of the battery cell. In another example, the reference charge protocol may be a protocol in which the battery cell is charged at the reference C-rate. In another example, a C-rate may mean the degree of a current to which the battery cell is charged for each step. In another example, the reference C-rate may be 0.33 C.

The determining unit 140 may determine a charge protocol having an internal resistance more similar to the internal resistance of the reference charge protocol as a result of comparison. For example, the determining unit 140 may calculate a similarity to the internal resistance of the reference charge protocol for each charge protocol and determine a charge protocol having a more similar internal resistance based on the calculated similarity. In another example, the similarity may be calculated based on a sum of absolute values of differences between the reference internal resistance and internal resistances calculated by the resistance calculating unit 120. In another example, the similarity may be calculated based on a mean value, a root mean square deviation, or a standard deviation of differences between the reference internal resistance and internal resistances calculated by the resistance calculating unit 120. According to an embodiment, the determining unit 140 may determine that a charge protocol calculated as having the higher similarity has a longer life than the other charge protocols. In this case, the life may be the number of cycles in which the battery cell may be charged according to a corresponding charge protocol.

In an embodiment, at least some of the information obtaining unit 110, the resistance calculating unit 120, the comparing unit 130, and the determining unit 140 may be implemented as one module. For example, a microcontroller unit (MCU) may serve as all of the information obtaining unit 110, the resistance calculating unit 120, the comparing unit 130, and the determining unit 140. However, without being limited thereto, each of the information obtaining unit 110, the resistance calculating unit 120, the comparing unit 130, and the determining unit 140 may be implemented as a separate module.

A charge protocol inspection apparatus according to an embodiment disclosed herein may calculate an internal resistance of a battery cell for each charge protocol and determine based on the calculated internal resistance whether the charge protocol is suitable.

A charge protocol inspection apparatus according to an embodiment disclosed herein may determine suitability of a charge protocol based on an internal resistance by using a change of the internal resistance as a guide of the charge protocol because the change of the internal resistance is analyzed as originating from an anode.

In a charge protocol inspection apparatus according to an embodiment disclosed herein, a large cell may determine suitability of a charge protocol without manufacturing three electrodes of a monocell type.

Figure 2:
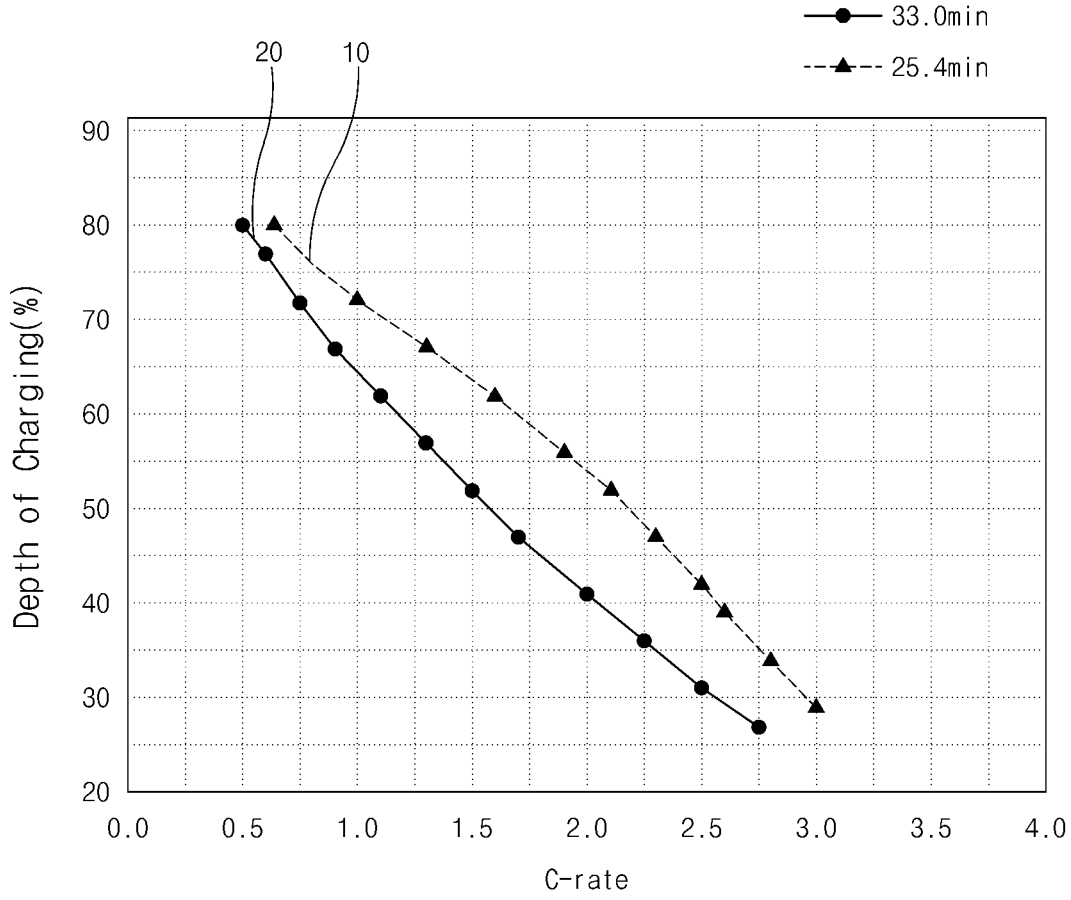
FIG. 2 is a diagram showing an example of a charge protocol according to an embodiment disclosed herein.

FIG. 2 is a diagram showing an example of a charge protocol according to an embodiment disclosed herein.

Referring to FIG. 2, it may be seen that a C-rate of a 25.4-minute charge protocol 10 is greater than a C-rate of a 33-minute charge protocol 20. To speed up charge of the battery cell, charge at a higher C-rate is desirable, such that the 25.4-minute charge protocol 10 may perform charge at a higher C-rate than the 33-minute charge protocol 20.

The 25.4-minute charge protocol 10 may perform charge at a C-rate of 3 up to a depth of charging of 30, at a C-rate of 2.75 up to a depth of charging of 35, and at a C-rate of 2.5 up to a depth of charging of 40. As such, a C-rate changes with a depth of charging because when charging is performed at a high C-rate, the precipitation of ions contained in the battery cell may rapidly progress, such that as the depth of charging increases, charging has to be performed at a lower C-rate.

In the 25.4-minute charge protocol 10 and the 33-minute charge protocol 20, a change of a C-rate with respect to a depth of charging may be referred to as a step. That is, the charge protocol may be configured with information about a current that charges the battery according to a step based on a time required for charging the battery.

Figure 3:
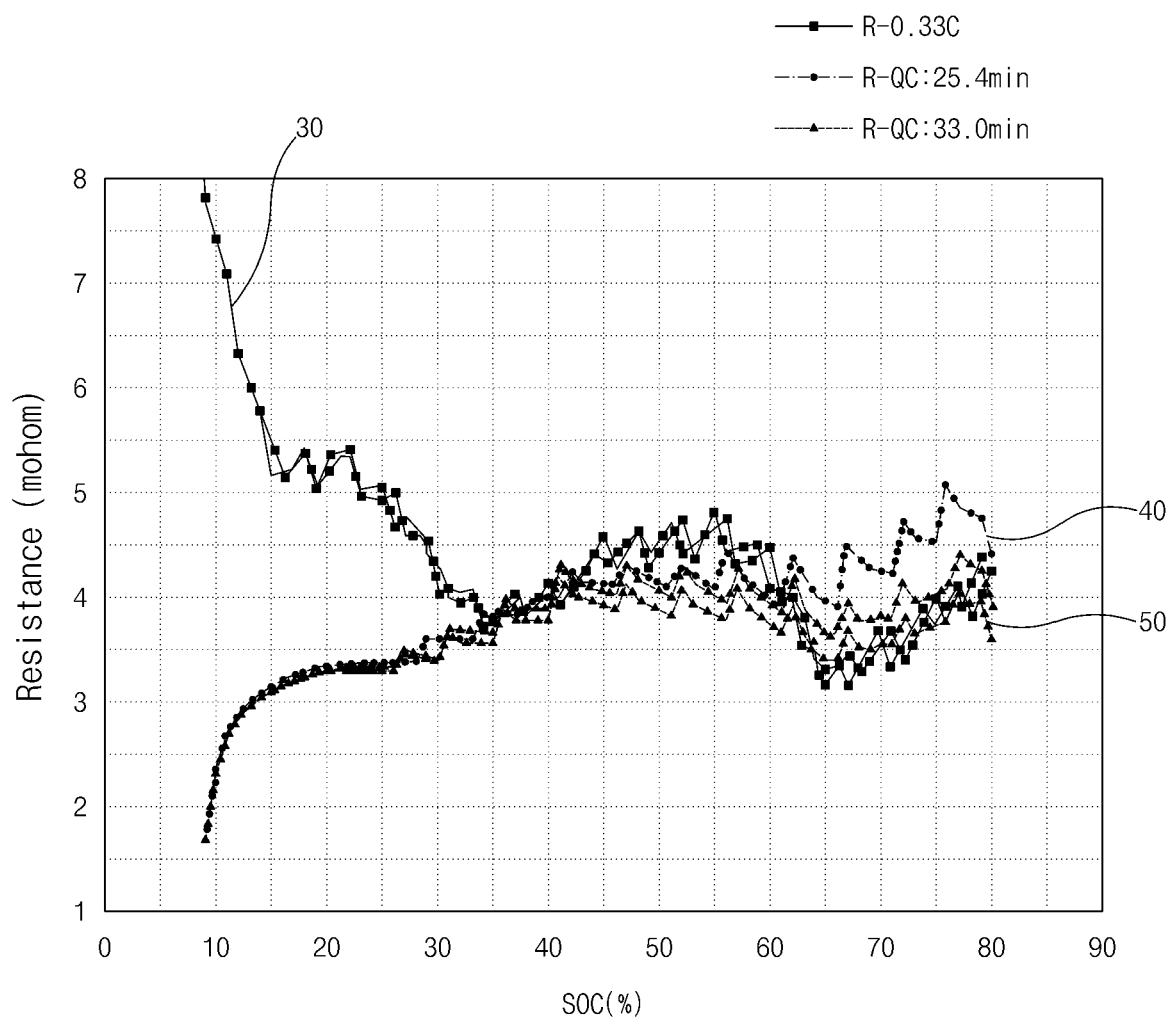
FIG. 3 is a diagram showing a change in an internal resistance per charge protocol according to an embodiment disclosed herein.

FIG. 3 is a diagram showing a change in an internal resistance per charge protocol according to an embodiment disclosed herein.

Referring to FIG. 3, a graph of a change in an internal resistance with respect to an SoC is shown, from which an internal resistance (a reference internal resistance 30) corresponding to charge at a C-rate of 0.33, an internal resistance 40 corresponding to charge according to the 25.4-minute charge protocol, and an internal resistance 50 corresponding to charge according to the 33-minute charge protocol may be seen.

The charge protocol inspection apparatus 100 may determine similarities of the internal resistance 40 corresponding to charge according to the 25.4-minute charge protocol and the internal resistance 50 corresponding to charge according to the 33-minute charge protocol with the reference internal resistance 30. For example, the charge protocol inspection apparatus 100 may determine the similarities of the internal resistance 40 corresponding to charge according to the 25.4-minute charge protocol and the internal resistance 50 corresponding to charge according to the 33-minute charge protocol with the reference internal resistance 30, in a specific SoC section. In an embodiment, the specific SoC section may be a section from an SoC of 60 to an SoC of 80, and the charge protocol inspection apparatus 100 may determine that the similarity between the internal resistance 50 corresponding to charge according to the 33-minute charge protocol and the reference internal resistance 30 is greater than the similarity between the internal resistance 40 corresponding to charge according to the 25.4-minute charge protocol and the reference internal resistance 30. In this case, the charge protocol inspection apparatus 100 may determine that charge according to the 33-minute charge protocol is more suitable than charge according to the 25.4-minute charge protocol, and determine that the cycle life of the battery for charge according to the 33-minute charge protocol is longer than that for charge according to the 25.4-minute charge protocol.

Figure 4:
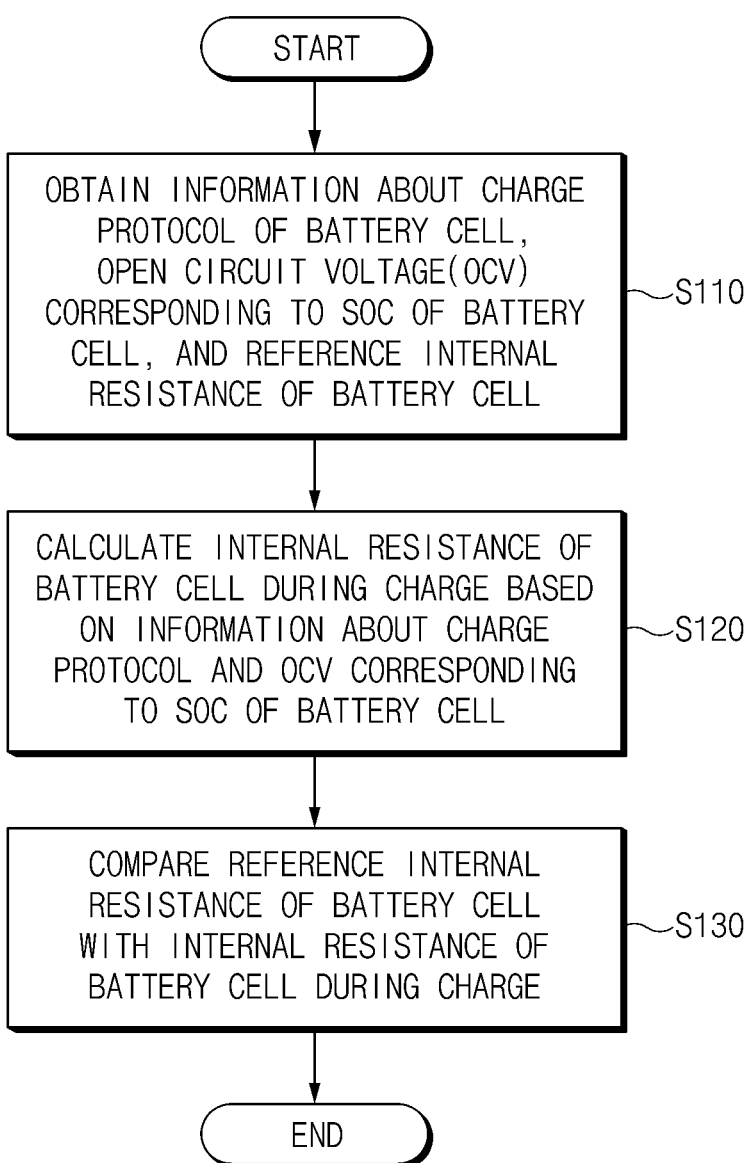
FIG. 4 is a flowchart showing an operating method of a charge protocol inspection apparatus according to an embodiment disclosed herein.

FIG. 4 is a flowchart showing an operating method of a charge protocol inspection apparatus according to an embodiment disclosed herein.

Referring to FIG. 4, an operating method of the charge protocol inspection apparatus 100 according to an embodiment disclosed herein may include operation S110 of obtaining information about a charge protocol of a battery cell, an OCV corresponding to an SoC of the battery cell, and a reference internal resistance of the battery cell, operation S120 of calculating an internal resistance of the battery cell during charge based on the information about the charge protocol and the OCV corresponding to the SoC of the battery cell, and operation S130 of comparing the reference internal resistance of the battery cell with the internal resistance of the battery cell during charge.

In operation S110 of obtaining the information about the charge protocol of the battery cell, the OCV corresponding to the SoC of the battery cell, and the reference internal resistance of the battery cell, the information obtaining unit 110 may obtain the information about the charge protocol of the battery cell, the OCV corresponding to the SoC of the battery cell, and the reference internal resistance of the battery cell. For example, the information about the charge protocol of the battery cell may include a voltage corresponding to the SoC of the battery cell when the battery cell is charged for each charge protocol. In another example, the information obtaining unit 110 may obtain the OCV for each SoC of the battery cell. In another example, the reference internal resistance of the battery cell may be an internal resistance in which the battery cell is charged at the reference C-rate. According to an embodiment, the C-rate may mean the degree of a current to which the battery cell is charged for each step. For example, the reference C-rate may be 0.33 C.

In operation S120 of calculating the internal resistance of the battery cell during charge based on the information about the charge protocol and the OCV corresponding to the SoC of the battery cell, the resistance calculating unit 120 may calculate the internal resistance of the battery cell during charge based on the information about the charge protocol and the OCV corresponding to the SoC of the battery cell. For example, the resistance calculating unit 120 may calculate the internal resistance of the battery cell during charge for each SoC of the battery cell.

In operation S130 of comparing the reference internal resistance of the battery cell with the internal resistance of the battery cell during charge, the comparing unit 130 may compare the reference internal resistance of the battery cell with the internal resistance of the battery cell during charge, calculated by the resistance calculating unit 120. For example, the comparing unit 130 may compare the reference internal resistance of the battery cell with the internal resistance of the battery cell during charge, for each SoC of the battery cell. In another embodiment, the comparing unit 130 may compare the reference internal resistance of the battery cell with the internal resistance of the battery cell during charge for each charge protocol. In another example, the comparing unit 130 may compare the reference internal resistance of the battery cell with the internal resistance of the battery cell during charge, in a specific SoC section.

Figure 5:
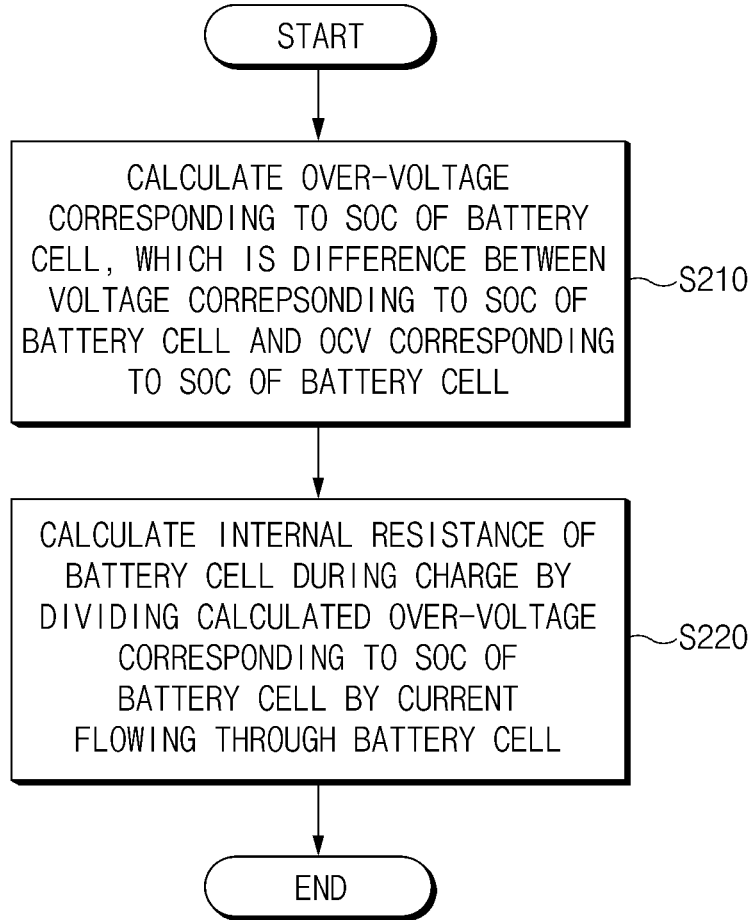
FIG. 5 is a flowchart showing in detail an operating method of a charge protocol inspection apparatus according to an embodiment disclosed herein.

FIG. 5 is a flowchart showing in detail an operating method of a charge protocol inspection apparatus according to an embodiment disclosed herein.

Referring to FIG. 5, an operating method of the charge protocol inspection apparatus 100 according to an embodiment disclosed herein may include operation S210 of calculating an over-voltage corresponding to an SoC of the battery cell, which is a difference between a voltage corresponding to the SoC of the battery cell and an OCV corresponding to the SoC of the battery cell, and operation S220 of calculating the internal resistance of the battery cell during charge by dividing the calculated over-voltage corresponding to the SoC of the battery cell by a current flowing through the battery cell. In an embodiment, operations S210 and S220 may be included in operation S120 of FIG. 4.

In operation S210 of calculating the over-voltage corresponding to the SoC of the battery cell, which is the difference between the voltage corresponding to the SoC of the battery cell and the OCV corresponding to the SoC of the battery cell, the resistance calculating unit 120 may calculate the over-voltage corresponding to the SoC of the battery cell, which is the difference between the voltage corresponding to the SoC of the battery cell and the OCV corresponding to the SoC of the battery cell.

In operation S220 of calculating the internal resistance of the battery cell during charge by dividing the calculated over-voltage corresponding to the SoC of the battery cell by a current flowing through the battery cell, the resistance calculating unit 120 may calculate the internal resistance of the battery cell by dividing the over-voltage corresponding to the SoC of the battery cell by the current flowing through the battery cell, For example, the current flowing through the battery cell may be the current flowing the battery cell according to the SoC when the battery cell is charged according to a corresponding charge protocol.

Figure 6:
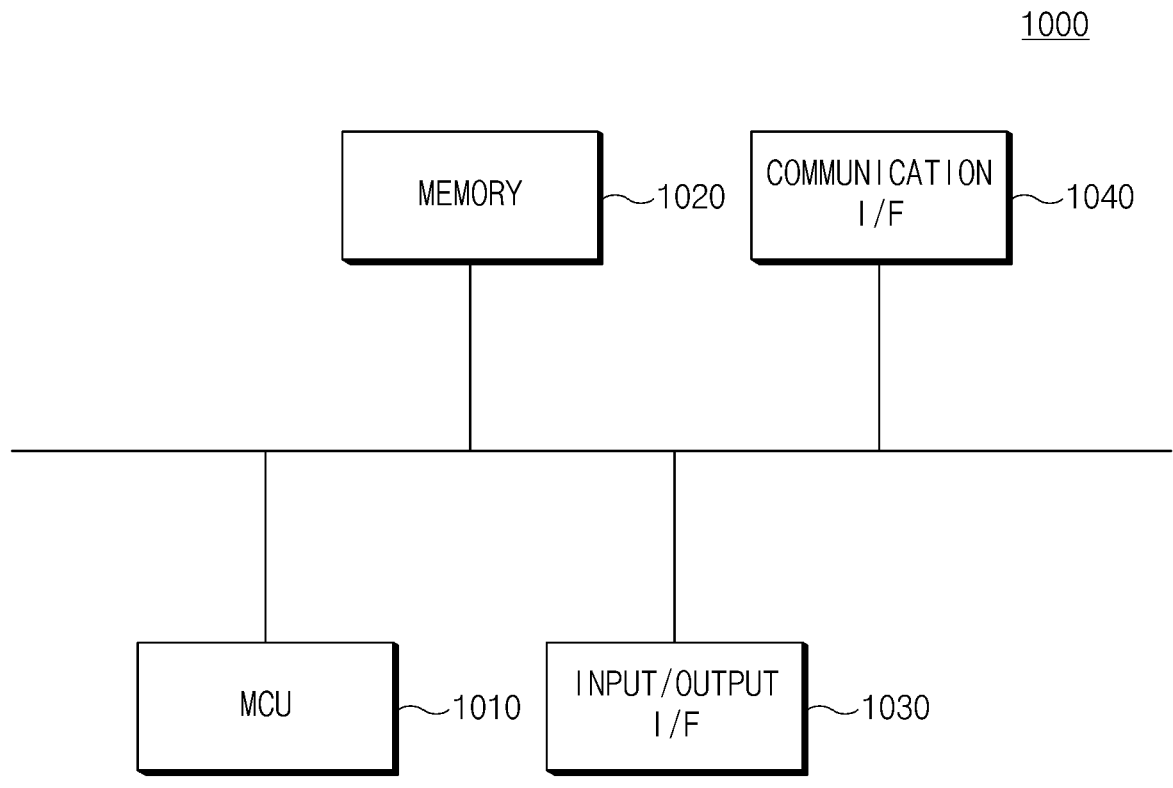
FIG. 6 is a block diagram showing a hardware configuration of a computing system for performing an operating method of a charge protocol inspection apparatus, according to an embodiment disclosed herein.

FIG. 6 is a block diagram showing a hardware configuration of a computing system for performing an operating method of a charge protocol inspection apparatus, according to an embodiment disclosed herein.

Referring to FIG. 6, a computing system 1000 according to an embodiment disclosed herein may include an MCU 1010, a memory 1020, an input/output I/F 1030, and a communication I/F 1040.

The MCU 1010 may be a processor that executes various programs (e.g., a battery pack voltage or current collection program, a relay control program included in a battery pack, an internal resistance calculation program, etc.) stored in the memory 1020, processes various information including the internal resistance of the battery and comparison information between the internal resistance of the battery and the reference internal resistance, and performs functions of the charge protocol inspection apparatus of FIG. 1 described above.

The memory 1020 may store various programs regarding log information collection and diagnosis of the battery, etc. The memory 1020 may also store various information such as a current, a voltage, an internal resistance, an OCV, charge protocol information, etc., of the battery.

The memory 1020 may be provided in plural, depending on a need. The memory 1020 may be volatile memory or non-volatile memory. For the memory 1020 as the volatile memory, random access memory (RAM), dynamic RAM (DRAM), static RAM (SRAM), etc., may be used. For the memory 1020 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 1020 are merely examples and are not limited thereto.

The input/output I/F 1030 may provide an interface for transmitting and receiving data by connecting an input device (not shown) such as a keyboard, a mouse, a touch panel, etc., and an output device such as a display (not shown), etc., to the MCU 1010.

The communication I/F 1040, which is a component capable of transmitting and receiving various data to and from a server, may be various devices capable of supporting wired or wireless communication. For example, the battery management apparatus may transmit and receive a relay control program included in a battery pack or information such as a current, a voltage, or an internal resistance of various battery packs from an external server separately provided through the communication I/F 1040.

As such, a computer program according to an embodiment disclosed herein may be recorded in the memory 1020 and processed by the MCU 1010, thus being implemented as a module that performs functions shown in FIG. 1.

The above description is merely illustrative of the technical idea of the present disclosure, and various modifications and variations will be possible without departing from the essential characteristics of embodiments of the present disclosure by those of ordinary skill in the art to which the embodiments disclosed herein pertains.

Therefore, the embodiments disclosed herein are intended for description rather than limitation of the technical spirit of the embodiments disclosed herein and the scope of the technical spirit of the present disclosure is not limited by these embodiments disclosed herein. The protection scope of the technical spirit disclosed herein should be interpreted by the following claims, and all technical spirits within the same range should be understood to be included in the range of the present disclosure.

The invention claimed is:

1. A charge protocol inspection apparatus comprising:
memory storing instructions; and
one or more processors configured to execute the instructions to:
obtain information about a charge protocol of a battery cell, an open circuit voltage (OCV) corresponding to a state of charge (SoC) of the battery cell, and a reference internal resistance of the battery cell;
calculate an internal resistance of the battery cell during charge based on the information about the charge protocol and the OCV corresponding to the SoC of the battery cell;
compare the reference internal resistance of the battery cell with the calculated internal resistance of the battery cell during charge; and
determine a suitability of the charge protocol for charging the battery cell based on the comparison.

2. The charge protocol inspection apparatus of claim 1, wherein the one or more processors are configured to compare the reference internal resistance of the battery cell with internal resistances of the battery cell calculated while charging from a predetermined first SoC to a predetermined second SoC.

3. The charge protocol inspection apparatus of claim 1, wherein the charge protocol comprises information about a current charging the battery, associated with an amount of time required for charging the battery with the current.

4. The charge protocol inspection apparatus of claim 3, wherein the amount of time required for charging the battery is 30 minutes or less.

5. A charge protocol inspection apparatus comprising:
memory storing instructions; and
one or more processors configured to execute the instructions to:
obtain information about a charge protocol of a battery cell, an open circuit voltage (OCV) corresponding to a state of charge (SoC) of the battery cell, and a reference internal resistance of the battery cell, wherein the information about the charge protocol of the battery cell comprises a voltage corresponding to the SoC of the battery cell while the battery cell is charged according to the charge protocol;
calculate an internal resistance of the battery cell during charge based on the information about the charge protocol and the OCV corresponding to the SoC of the battery cell; and
compare the reference internal resistance of the battery cell with the calculated internal resistance of the battery cell during charge.

6. The charge protocol inspection apparatus of claim 5, wherein the one or more processors are further configured to:
calculate an over-voltage corresponding to the SoC of the battery cell, wherein the over-voltage is a difference between the voltage corresponding to the SoC of the battery cell and the OCV corresponding to the SoC of the battery cell; and
calculate the internal resistance of the battery cell during charge by dividing the calculated over-voltage corresponding to the SoC of the battery cell by a current flowing through the battery cell.

7. A charge protocol inspection apparatus comprising:
memory storing instructions; and one or more processors configured to execute the instructions to:

obtain information about a charge protocol of a battery cell, an open circuit voltage (OCV) corresponding to a state of charge (SoC) of the battery cell, and a reference internal resistance of the battery cell;

calculate an internal resistance of the battery cell during charge based on the information about the charge protocol and the OCV corresponding to the SoC of the battery cell;

compare the reference internal resistance of the battery cell with the calculated internal resistance of the battery cell during charge, wherein the one or more processors are further configured to calculate a respective internal resistance of the battery cell during charge for each of a plurality of charge protocols.

8. The charge protocol inspection apparatus of claim 7, wherein the one or more processors are further configured to compare the reference internal resistance of the battery cell with each respective internal resistance of the battery cell during charge.

9. The charge protocol inspection apparatus of claim 7, wherein the one or more processors are configured to compare the reference internal resistance of the battery cell with the respective internal resistance of the battery cell during charge, for each charge protocol.

10. The charge protocol inspection apparatus of claim 9, wherein the one or more processors are configured to determine a respective degree of similarity between reference internal resistance of the battery cell and each respective internal resistance of the battery cell.

11. The charge protocol inspection apparatus of claim 7, wherein two or more of the plurality of charge protocols are fast charge protocols capable of charging the battery in 30 minutes or less.

12. An operating method of a charge protocol inspection apparatus, the operating method comprising:

obtaining, by one or more processors, information about a charge protocol of a battery cell, an open circuit voltage (OCV) corresponding to a state of charge (SoC) of the battery cell, and a reference internal resistance of the battery cell;

calculating, by the one or more processors, an internal resistance of the battery cell during charge based on the information about the charge protocol and the OCV corresponding to the SoC of the battery cell;

comparing, by the one or more processors, the reference internal resistance of the battery cell with the calculated internal resistance of the battery cell during charge; and determine a suitability of the charge protocol for charging the battery cell based on the comparison.

13. The operating method of claim 12, wherein the information about the charge protocol of the battery cell comprises a voltage corresponding to the SoC of the battery cell while the battery cell is charged according to the charge protocol.

14. The operating method of claim 12, wherein calculating the internal resistance of the battery cell comprises:

calculating an over-voltage corresponding to the SoC of the battery cell, wherein the over-voltage is a difference between the voltage corresponding to the SoC of the battery cell and the OCV corresponding to the SoC of the battery cell; and calculating the internal resistance of the battery cell during charge by dividing the calculated over-voltage corresponding to the SoC of the battery cell by a current flowing through the battery cell.

\* \* \* \* \*